United States Patent
Höfer et al.

(10) Patent No.: US 7,247,940 B2
(45) Date of Patent: Jul. 24, 2007

(54) OPTOELECTRONIC DEVICE WITH PATTERNED-METALLIZED PACKAGE BODY, METHOD FOR PRODUCING SUCH A DEVICE AND METHOD FOR THE PATTERNED METALLIZATION OF A PLASTIC-CONTAINING BODY

(75) Inventors: Thomas Höfer, Lappersdorf (DE); Herbert Brunner, Regensburg (DE); Frank Möllmer, Matting b. Pentling (DE); Günter Waitl, Regensburg (DE); Rainer Sewald, Taufkirchen (DE); Markus Zeiler, Nittendorf (DE)

(73) Assignee: Osram Opto Semiconductor GmbH, Regensburg (DE)

( * ) Notice: Subject to any disclaimer, the term of this patent is extended or adjusted under 35 U.S.C. 154(b) by 0 days.

(21) Appl. No.: 10/792,538

(22) Filed: Mar. 1, 2004

(65) Prior Publication Data
US 2004/0232435 A1  Nov. 25, 2004

(30) Foreign Application Priority Data
Feb. 28, 2003  (DE) .................................. 103 08 917
Sep. 26, 2003  (DE) ............................ 203 14 966 U

(51) Int. Cl.
*H01L 23/03* (2006.01)
(52) U.S. Cl. ..................... 257/729; 257/730; 257/787; 257/795
(58) Field of Classification Search ........... 257/79–103
See application file for complete search history.

(56) References Cited

U.S. PATENT DOCUMENTS

| | | | |
|---|---|---|---|
| 4,593,485 A | 6/1986 | Thillays | |
| 5,035,483 A | 7/1991 | Waitl et al. | |
| 5,298,768 A | 3/1994 | Okazaki et al. | |
| 5,534,718 A * | 7/1996 | Chang | ........................ 257/98 |
| 6,050,828 A | 4/2000 | Leeman et al. | |
| 6,147,367 A * | 11/2000 | Yang et al. | .................... 257/88 |
| 6,169,295 B1 * | 1/2001 | Koo | ........................... 257/81 |

(Continued)

FOREIGN PATENT DOCUMENTS

DE            30 37 676 A1      5/1982

(Continued)

OTHER PUBLICATIONS

H. Yamanaka et al., "MID Technology to Miniaturize Electro-Optical Devices", 4. International Congress; Molded Interconnected Devices; MID 2000; Sep. 27, 2000, pp. 129-138.

(Continued)

*Primary Examiner*—Wai-Sing Louie
(74) *Attorney, Agent, or Firm*—Cohen Pontani Lieberman & Pavane LLP

(57) ABSTRACT

An optoelectronic device, comprising a package body (57) and at least one semiconductor chip (50) arranged on the package body (57). The surface of the package body (57) has a metallized subregion (15) and a non-metallized subregion (20). The package body (57) includes at least two different plastics (53, 54), one of the plastics being non-metallizable (54) and this plastic determining the non-metallized subregion (20). A method for producing such components and a method for the patterned metallization of a plastic-containing body are also provided.

36 Claims, 9 Drawing Sheets

U.S. PATENT DOCUMENTS

| | | |
|---|---|---|
| 6,459,130 B1 | 10/2002 | Arndt et al. |
| 6,518,600 B1 * | 2/2003 | Shaddock ................. 257/98 |
| 6,627,922 B1 * | 9/2003 | Ishinaga .................. 257/99 |
| 6,747,726 B1 | 6/2004 | Birke |
| 2003/0020077 A1 * | 1/2003 | Horiuchi et al. ............ 257/81 |

FOREIGN PATENT DOCUMENTS

| | | |
|---|---|---|
| DE | 44 16 986 A1 | 5/1995 |
| DE | 200 04 900 U1 | 8/2000 |
| DE | 199 22 369 A1 | 11/2000 |
| DE | 100 04 162 A1 | 8/2001 |
| DE | 102 14 121 C1 | 3/2002 |
| JP | 07038154 A | 2/1995 |
| JP | 09045965 A | 2/1997 |
| JP | 11054801 A | 2/1999 |
| JP | 2000244022 | 9/2000 |
| WO | WO 01/57960 A1 | 8/2001 |

OTHER PUBLICATIONS

F. Mollmer et al., "Siemens SMT-TOP-LED for Surface Mounting", Siemens Components 29, (1991), No. 4, pp. 147-149.

\* cited by examiner

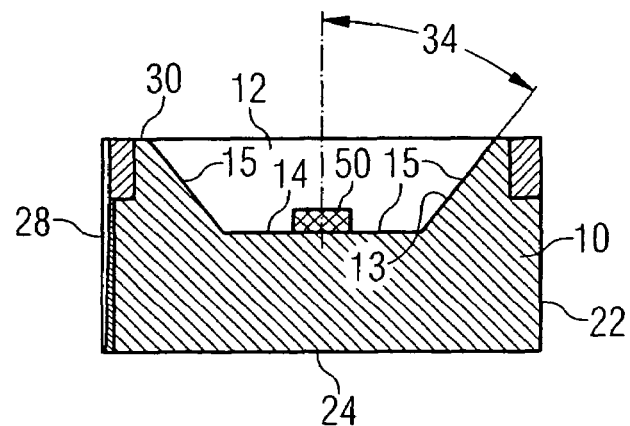
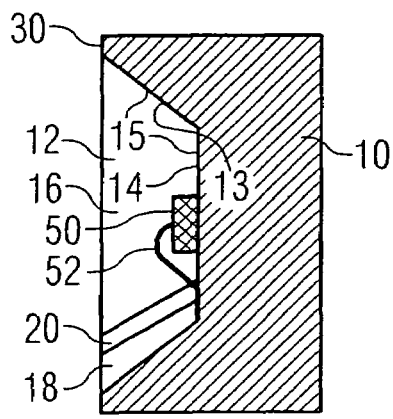
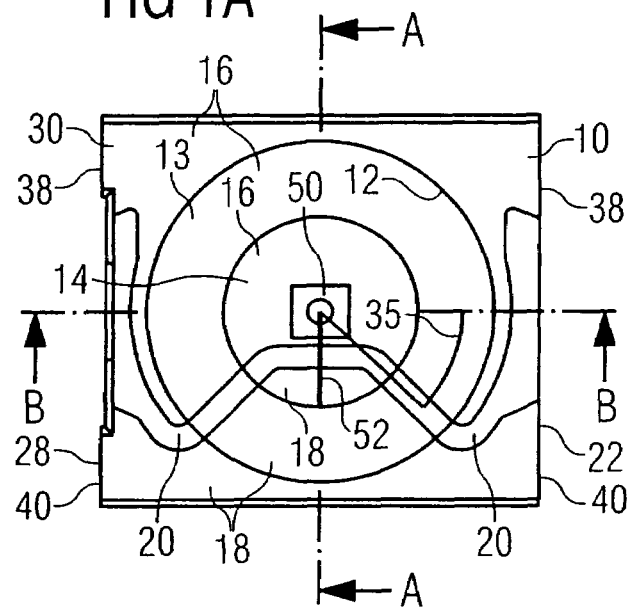
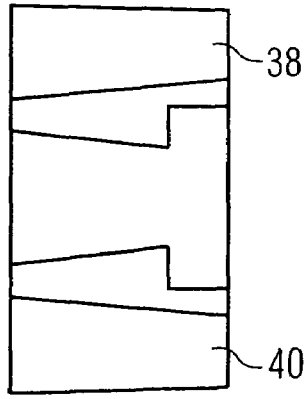
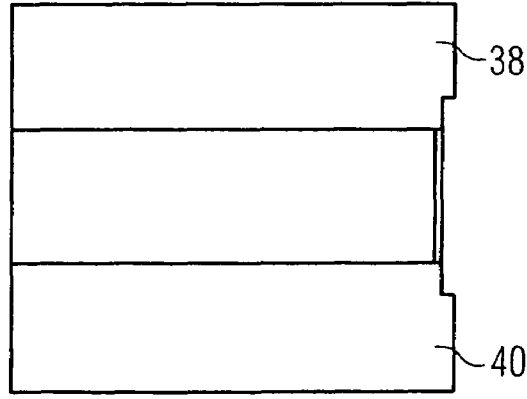

OPTOELECTRONIC DEVICE WITH PATTERNED-METALLIZED PACKAGE BODY, METHOD FOR PRODUCING SUCH A DEVICE AND METHOD FOR THE PATTERNED METALLIZATION OF A PLASTIC-CONTAINING BODY

RELATED APPLICATIONS

This patent application claims the priority of the German patent applications 10308917.9 filed Feb. 28, 2003 and 203 14 966.1 filed Sep. 26, 2003, the disclosure of which is hereby incorporated by reference.

FIELD OF THE INVENTION

The present invention relates to an optoelectronic device, in particular to a surface-mountable optoelectronic device, to a method for the patterned metallization of a plastic-containing package body for an optoelectronic device, and to a method for producing an optoelectronic device with a plastic-containing package body and at least one semiconductor arranged on the package body.

BACKGROUND OF THE INVENTION

In the case of conventional surface-mountable optoelectronic devices, a prepackaged device is often initially produced by a prefabricated semiconductor frame (leadframe) being encapsulated at least partly by injection-moulding with a suitable plastic material, which plastic material forms at least part of the package of the device. This device has, for example, on the upper side a depression or recess into which leadframe terminals are inserted from two opposite sides, with a semiconductor chip, such as for example an LED chip, being adhesively attached and electrically contacted on one of said terminals. This recess is then generally filled with transparent casting compound. This basic form of surface-mountable optoelectronic devices is known for example from the article "Siemens SMT-TOPLED für die Oberflächenmontage" [Siemens SMT-TOPLED for surface mounting] by "F. Möllmer and G. Waitl, Siemens Components 29 (1991), issue 4, pages 147-149".

Such devices are used as transmitters and receivers, for example in remote controls, light barriers or for data transmission between a cell phone and a computer. If the optoelectronic component is formed as a transmitter, often a narrow-angled radiation characteristic that is as homogeneous as possible is desired. This may also be the case with a component formed as a receiver. In the case of conventional SMT types of construction, this radiation characteristic is frequently achieved by means of a lens mounted for example on the device. Such lens is a premolded plastic which is subject to degradation due to incoming ultraviolet radiation, for example. The resulting diffuse plastic reflector is disadvantageous for projecting the image of the light source via the lens. In addition, the overall height of the optoelectronic device is increased by the lens. Apart from an increased space requirement, there is the disadvantage that the surface of the device is not planar, with the result that it is only with greater difficulty that the process of the "pick and place" method can be used for printed circuit board assembly.

Also known are so-called MIDs (Molded Interconnect Devices), which, by contrast with the devices described above, dispense with a leadframe. In the case of these devices, after the production of a body of plastic of any desired form by means of injection molding, a metallization is applied to the surface of the same.

An optoelectronic device produced by this method and a method for producing the metallization by means of laser patterning of a metallization is known from the article "MID Technology to miniaturize electro-optical devices" by H. Yamanaka, T. Suzuki, S. Matsushima, 4th Intern. Congress on Molded Interconnect Devices MID 2000, Sep. 27 to 28, 2000, pages 129-138. Although the optoelectronic device described in this article can be produced in a simple way, it relies on a lens, as revealed by FIGS. 4 to 6 of this article. The device consequently likewise has the problems described above.

SUMMARY OF THE INVENTION

One object of the present invention is to provide an improved optoelectronic device which can be produced in a simple way and also a simplified method for producing an optoelectronic device.

A further object of the invention is to provide an improved method for the patterned metallization of a plastic-containing body, in particular a package body for an optoelectronic device.

These and other objects are attained in accordance with one aspect of the present invention directed to an optoelectronic device having a package body and at least one semiconductor chip arranged on the package body. A surface of the package body has a metallized subregion and a non-metallized subregion, and the package body includes at least two different plastics, one of the plastics being non-metallizable, and this plastic determining the non-metallized subregion.

The term non-metallizable plastic may be understood for the purposes of the invention as meaning that a metallization of this plastic—at least with the metallic material for patterned metallization—is not possible, or only with considerable additional expenditure or difficulty in comparison with the metallizable plastic.

It should be noted that the metallized subregion and the non-metallized subregion do not have to be arranged on one planar surface area, such as a side face of the package body, but rather the entire surface of the package body may have a metallized subregion and a non-metallized subregion.

It is preferred that a further plastic, which the package body contains, is of a metallizable form. It is particularly preferred that this metallizable plastic determines the metallized subregion of the surface of the package body.

Suitable plastics are, for example, liquid-crystal polymers (LCPs) or polybutylene terephthalates (PBTs). The plastics are preferably of an electrically insulating form and may with particular preference be of a metallizable form, for example by addition of additives such as palladium, or a non-metallizable form.

Such an optoelectronic device has the advantage that a metallization does not have to be laboriously patterned after its application to the package body, but instead the pattern of the metallization can already be determined by the non-metallizable plastic and the metallizable plastic during the production of the package body, which takes place for example by a two-component injection-molding process using these plastics. It is consequently preferred that the metallization is patterning itself during its application. The plastics cited above by way of example can be processed in such an injection-molding process.

In a preferred configuration of the invention, a package of the optoelectronic device that comprises the package body has at least one recess, which may be formed for example in the package body. It is preferred that the semiconductor chip is arranged in the recess. Furthermore, it is preferred that the walls bounding the recess form a reflector for an electromagnetic radiation emitted by the semiconductor chip and they may be provided with a metallization, which at the same time may be of a reflective form and act as an electrical terminal conductor of the device. It is particularly preferred that the reflector is also of a form that is reflective for a radiation to be received by the semiconductor chip.

Another aspect of the invention is directed to an optoelectronic device having a package with at least one recess. At least one semiconductor chip is arranged in the recess. The walls bounding the recess form a reflector for an electromagnetic radiation emitted by the semiconductor chip and are provided with a metallization, which at the same time acts as an electrical terminal conductor of the device.

The optoelectronic device of such a design makes it possible to dispense with a lens and to achieve a preferably narrow-angled, homogeneous radiation or reception characteristic. The radiation or reception characteristic is advantageously obtained from the design of the reflector alone, which is formed for example as a cone, paraboloid, hyperboloid, ellipsoid, sphere reflector or as a segment of these bodies, such as for instance in the form of a truncated cone. In principle, any desired form of the recess, i.e. of the reflector, is possible. The shaping is merely limited by the method used for applying the metallization or the method for producing the package body. The forms of the recess given above by way of example are consequently not to be regarded as a restriction.

Preferred methods for metallizing the plastic-containing body, preferably consisting of plastic, are a two-component injection-molding process, an additive or subtractive laser patterning, a masking and patterning of the initially completely metallized surfaces or selective vapor deposition on the reflector using masking techniques.

Subtractive laser patterning means here the patterning of an already existing metallization by means of a laser-aided method, whereas in the case of additive laser patterning the regions to be metallized are defined by means of a laser-aided method.

It is preferred that, at least for the definition of a metallization of the recess, a two-component injection-molding process is used for the production of the package body, one component comprising at least one non-metallizable plastic and the other component comprising at least one plastic of a metallizable form, and the metallization of the recess being determined by the metallizable plastic and/or the non-metallizable plastic.

The pattern of the metallization can in this way be advantageously determined already by means of the configuration of the package body. A comparatively laborious patterning of an applied metallization can in this way be avoided, as can the patterned application of a metallization, such as for instance by laborious additive laser patterning.

The metallization of the recess permits a high yield of the semiconductor chip, formed for example as an LED chip. The efficiency of such a device can be improved considerably in comparison with a conventional optoelectronic device. Dispensing with the lens additionally permits a substantially planar device surface and a small overall height. As a result, the device can be mounted on a printed circuit board in a technically simple and low-cost way by means of a pick-and-place method.

In a preferred configuration of the invention, the metallization is divided into at least two regions that are electrically separated from each other by an insulating web (or better an insulating gap in the metallization). This makes possible devices of a particularly small overall height, since the semiconductor chip can be applied to a first region of the metallization and/or an electrical connection between the semiconductor chip and a second region can be established within the recess or the reflector.

The insulating web is advantageously arranged in the region of the surface areas bounding the recess, and the electrical connection between the semiconductor chip and the second region is established in the recess. In other words, the insulating web is preferably provided in the interior of the recess or the reflector.

It is particularly preferred that the insulating web is determined by the non-metallizable plastic of the package body.

In a preferred configuration of the insulating web, the latter runs through the bottom surface area of the recess and an electrical connection between the semiconductor chip and the second region of the metallization is established at the bottom of the recess. This advantageously allows a greater reflector height to be achieved, without increasing the height of the device. As a result, an often desired narrow-angled and homogeneous radiation or reception characteristic can be produced in a simple way, since the bonding connection between the semiconductor chip and the metallization takes place in the interior of the recess or the reflector. In the case of this variant, it is preferred that the arc of the bonding wire is placed in the space enclosed by the recess or the reflector. It is particularly preferred that it is not led over the edge of the recess or the reflector.

In a development of the above configuration, the insulating web crosses through the recess in such a way that it runs over the reflector walls out of the recess at least partly in the extension of at least one plane diagonal of the semiconductor chip (seen in plan view). As a result, a higher reflector efficiency can be achieved. The greatest proportion of the radiation emerging laterally from the semiconductor chip leaves via its side faces and not via the vertical chip corners. Only a small part of the radiation leaves at the vertical chip corners. The insulating web, which is not reflective or is only reflective to a reduced extent, is therefore preferably located in the diagonal extension with respect to the corners of the semiconductor chip.

In a further preferred configuration of the insulating web, it is arranged in the region of an indentation or relief (or bulge) of the recess. It is preferred that the insulating web or the indentation or relief is arranged in such a way that only a smallest possible part of the radiation generated by the semiconductor chip impinges on it and in this way the reflector efficiency is advantageously increased. The indentation or relief is preferably provided in a wall of the recess. It is particularly preferred that the reflector surface area is reduced by this as little as possible.

This also has the advantage that the bonding connection can take place in the region of the indentation or relief of the wall of the recess and not on its bottom. The bottom of the recess can in this way be advantageously reduced in size, which can have advantageous effects on the size of the device.

According to a further advantageous configuration of the invention, the surface area taken up by the insulating web is as small as possible in comparison with the metallized surface area in the recess. This means that the insulating web is made as narrow as possible, since—by contrast with the metallization—it frequently does not have good reflecting properties. The insulating web may be produced by simple interruption of the metallization, for example caused by a non-metallizable plastic on or at the surface of the package body, just big enough to avoid a short-circuit between the separated metallization regions.

According to a further advantageous configuration, the package includes a plastic comprising two components, the application of a metallization being possible only on one of the two components. The package in this case comprises a two-component injection molding, the surface areas and patterns that are to be metallized already being defined by the injection mold. In particular, this applies with preference to the insulating web. The fact that the package consists of two plastics means that the production of such a package can be simplified, since, advantageously, only two different injection molds or injection mold inserts—one for each plastic—are used for the injection molding. As a result, expenditure for the production of the package or of the package body can be advantageously kept low.

In a preferred configuration of the package body, it comprises a first package body piece, which contains the metallizable plastic, and at least one further package body piece, which contains the non-metallizable plastic. It is preferred that the first package body piece is formed in at least two subregions, which are mechanically connected to each other by means of a connecting device, such as for example connecting webs, which preferably have a smaller spatial extent in comparison with the subregions of the package body and, advantageously, can mechanically stabilize the package body piece.

It is preferred that the further package body piece is arranged such that it at least partly forms around the connecting device. This allows the mechanical stability of the package body to be advantageously increased. This applies in particular if the package body pieces or the plastics which contain the package body pieces are not substantially chemically bonded to one another or do not substantially enter into a chemical bond with one another.

In an advantageous development of the above configuration, arranged between the first package body piece and the further package body piece is at least one intermediate space, which may be caused for example by an absent chemical bond between the package body pieces in the region of the intermediate space. The intermediate space advantageously forms a resilience, which can substantially compensate for or at least reduce mechanical, in particular thermally caused, stresses of the package body, as may occur between the package body pieces for example when there are changes in temperature.

The design of the device according to the invention brings with it the advantage that the plastic of the package can be colored in any color desired. In the case of conventional optoelectronic devices which have no metallization of the reflector, the use of a bright plastic is customary on account of its reflective properties to achieve a high efficiency of the device. However, such plastics frequently display aging effects when they are exposed to UV radiation. The surface of the plastic is protected to the greatest extent from UV radiation by the metal coating according to the invention. Consequently, a discoloration of the reflector walls is significantly reduced, whereby the reliability of the device is also increased. Discolorations can occur only in the region of the insulating web.

It is preferred that use of a dark plastic is considered, since the highly reflective property is no longer required.

The use of a second plastics component permits coloration of the devices, to increase contrast. For example, black plastic can be used for the entire device.

In the case of an advantageous configuration, the optoelectronic device according to the invention is a Molded Interconnect Device (MID). This permits simple production of the device and, in particular, any desired form of construction. All the metal conductors and areas are only produced after completion of the injection-molding operation and run on the surfaces of the device. A further advantage is that two adjoining surfaces can be arranged at any desired arbitrary angle in relation to each other. As a result, later orientation of the device can already be set during the production of the package, in that the inclination of the bottom of the device is correspondingly set with respect to the bottom of the reflector. This different design can be achieved in a simple way by modified mold inserts during the injection molding. By contrast with previous SMT devices, in which the inclination was usually set by modified bending of the leadframe, a form of construction which is particularly robust and can be mounted well can be achieved by the procedure according to the invention. In particular, this allows previously existing problems with regard to production and tolerances to be avoided.

The fact that it is preferred that the metallization, in particular that of the reflector, also undertakes electrical functions, for example as a terminal conductor for the semiconductor chip, means that the forming of particularly small devices is possible. No additional surface areas have to be made available for the forming and leading out of the electrical terminals.

In a further preferred configuration, at least two electrical terminals are provided, with preference on at least two surfaces of the package. The subsequent application of the metallization to the preformed package allows the electrical terminals to be advantageously arranged in any way desired on the surfaces of the package. As a result, the size of the device can be minimized, in particular when more than four electrical terminals are required, as is usually the case for optoelectronic components with a number of semiconductor chips. It is particularly preferred that the configuration of the electrical terminals is determined by the metallizable plastic and/or the non-metallizable plastic. Furthermore, the number of terminals can be determined by the shape of the insulating web or the configuration of the non-metallizable plastic of the package body.

To improve the thermal conductivity, it is envisaged to provide the package with metal particles, a heat sink or a thermal through-connection.

The present invention can be used not only in the case of optoelectronic devices that are produced on the principle of MID, but can also be used in devices with a leadframe. In such a configurational variant, one region of the reflector metallization is formed by a metallic leadframe. The leadframe forms for example at least part of the bottom of the recess, while the walls of the recess are metallized according to the invention. The properties of conventional SMT devices can be improved in a simple way by the metallization of the reflector. In particular, it is preferred that the metallization is determined by the metallizable plastic and/or the non-metallizable plastic.

When there are a number of recesses in a package, they may be shaped differently from one another, be of different sizes and/or also accommodate different semiconductor chips than one another, such as for example an LED chip, a photodiode chip and an IC chip. Consequently, the semiconductor chips integrated in the optoelectronic device may comprise both optoelectronic semiconductor chips such as light-emitting diodes and detectors and electronic semiconductor chips with integrated driving circuits.

Another aspect of the present invention is directed to a method for the patterned metallization of a plastic-containing body. The body is initially produced by means of a two-component injection-molding process with at least two plastics, one of which is non-metallizable, and the body is subsequently metallized in such a way that a metallized region and a non-metallized region are formed, the non-metallized region being determined by the non-metallizable plastic.

The metallized region is preferably determined by a plastic of a metallizable form. It is particularly preferred that the two components of the injection-molding process are consequently formed by non-metallizable and metallizable plastics.

The metallization preferably takes place at least partly on the surface of the body that is formed at least partly by the metallizable plastic and the non-metallizable plastic.

The metallization may be produced by means of chemical and/or galvanic treatment of the body. It is preferred that the chemical treatment take places before the galvanic treatment.

In such a method for the patterned metallization of the plastic-containing body, the pattern of the metallization is already determined during the production of the body. It is advantageously possible to dispense with subsequent patterning measures, such as laser patterning.

This method is used with preference for the patterned metallization of a body which is formed as a package body for an electronic device, in particular a microelectronic or optoelectronic device.

In a preferred method according to the invention for producing an optoelectronic device with a package body and at least one semiconductor chip arranged on the package body, initially the package body is produced, by means of injection molding with at least two different plastics, one of the plastics being non-metallizable.

Subsequently, the package body is metallized in such a way as to create a metallized subregion and a non-metallized subregion of the package body, the non-metallized subregion being determined by the non-metallizable plastic, and the metallized subregion of the package body being determined with preference by a plastic of a metallizable form. It is consequently particularly preferred that the two components of the injection-molding process are formed by non-metallizable and metallizable plastics.

It is preferred that the metallized region of the package body is arranged on the surface of the latter and can undertake an electrical and/or reflecting function. It is particularly preferred that the non-metallized region separates the metallized region into at least two regions which are electrically insulated from each other and can form the terminal conductors for the semiconductor chip.

Such a method has the advantage that the arrangement or the pattern of the metallization can already be determined during the production of the package body. This takes place by the use of metallizable and non-metallizable plastics in the production of the package body by the two-component injection-molding process. Instead of an injection-molding process, compression-molding or injection compression-molding processes may also be used, provided that they are suitable for the production of a plastic-containing body, in particular a package body for an optoelectronic device, of the type stated above.

These methods according to the invention are used with preference in the production of the optoelectronic devices described further above and below, with the result that their features can also correspondingly relate to the method for producing an optoelectronic device or to the method for the patterned metallization of a plastic-containing body, or vice versa.

BRIEF DESCRIPTION OF THE DRAWINGS

Further features, preferred developments and embodiments of the optoelectronic device according to the invention and of the methods, as well as further advantages and expedient aspects of the invention emerge from the exemplary embodiments explained below with reference to FIGS. 1 to 7, in which FIGS. 1A to 1E show a schematic representation of a first exemplary embodiment with a semiconductor chip a plan view from above (1A), two sectional representations (1B, 1C), one side view (1D) and a plan view from below (1E)

DETAILED DESCRIPTION OF THE DRAWINGS

Figure 2B:
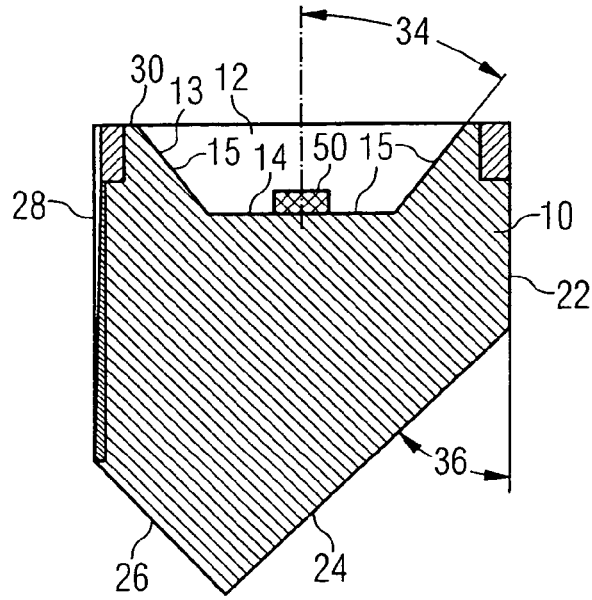
FIGS. 2A to 2F show a schematic representation of a second exemplary embodiment with a semiconductor chip in a plan view from above (2A), a section (2B), a side view (2C), a plan view from below (2D) and two perspective representations (2E, 2F)
Figure 2C:
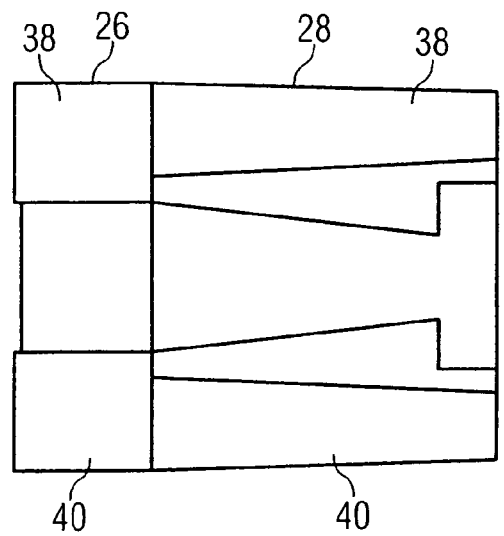

In the exemplary embodiments, component parts that are the same or act in the same way are respectively provided with the same reference numerals.

The device according to the first exemplary embodiment is a surface-mountable optoelectronic device, in the case of which a recess 12 is provided in a package 10 (cf. FIG. 1a). As can best be seen from FIGS. 1B and 1C, the recess 12 as the form of a truncated cone. A wall of the recess 12 is designated by the reference numeral 13 and the bottom of the recess 12 is designated by the reference numeral 14.

Arranged in the central region of the bottom 14 is a semiconductor chip 50, for example an LED chip. The surface of the package 10 and regions of the recess 12 are provided with a metallization 15. The metallization 15 is subdivided into two regions 16, 18, which are electrically separated from each other by means of an insulating web 20 (or better an insulating slit).

The region 16 of the metallization 15 extends from the bottom 14 of the recess 12 over the wall 13 of the latter onto a surface 30 of the package 10. The semiconductor chip 50 has been mounted on this region 16 of the metallization 15 and is electrically connected to it. The semiconductor chip 50 is connected to the further region 18 of the metallization 15 by means of a bonding wire 52. The region 18 of the metallization 15 likewise extends from the bottom 14 over the wall 13 to the surface 30 of the package 10. The metallization 18 is in this case electrically separated from the region 16 of the metallization 15 on all surface areas.

The surface area taken up by the metallization 15 within the reflector is as large as possible in comparison with the surface area that is taken up by the insulating web 20. Since the reflection of the light emitted by the semiconductor chip is significantly smaller in the region of the insulating web 20 in comparison with the metallized region, the insulating web crosses through the recess 12 in such a way that it lies in the extension of the plane diagonal of the semiconductor chip 50. As shown in FIG. 1B, the insulating web 20 is led along the bottom 14 and the walls 13 out of the recess 12 in the extension of the front-side diagonal of the chip at an angle of 35°. This design allows a high reflector efficiency to be achieved, since the greatest proportion of the radiation of the semiconductor chip 50 leaves at its side faces and not at the perpendicular corners. In other words, as only a small amount of light leaves the chip at the vertical edges, it is advantageous to arrange an insulating web with lower reflectivity in directions extending diagonally from the middle of the chip to the edges. In this way only a relatively small amount of light is subject to reflection at the insulating web having lower reflection.

The section, represented in FIG. 1B, through the optoelectronic device according to FIG. 1A along the line A-A depicted in FIG. 1A, illustrates the frustoconical form of the recess 12 or the reflector and the division into two parts of the metallization 15, into the regions 16, 18. The semiconductor chip 50 is arranged on the bottom 14 of the recess 12. The bonding wire 52 crosses over the insulating web 20 and connects the side of the semiconductor chip 50 that is facing away from the bottom 14 to the metallization 18. It can be seen well from FIG. 1B that the insulating web 20 extends from the bottom 14 along the wall 13 onto the surface 30.

FIG. 1C shows a sectional view along the line B-B depicted in FIG. 1A. This view illustrates that the visible region of the wall 13 of the reflector is provided throughout with the region 16 of the metallization 15.

FIGS. 1D and 1E show that the regions 16, 18 of the metallization 15 also extend along the surface 28 as far as the rear side of the package and form external electrical terminals 38, 40.

The arrangement of the electrical terminals 38, 40 both on the lateral surfaces 28, 22 and on the surface 24, which forms the rear side, allows the optoelectronic device to be used both as a toplooker (i.e., the plane of the opening of the recess of the package body is essentially parallel to the circuit board) and as a sidelooker (i.e., the plane is essentially perpendicular to the plane of the circuit board).

The optoelectronic device represented in FIGS. 1A to 1E is a Molded Interconnect Device (MID). This means that the package body 10 is produced by an injection-molding process. A two-component injection-molding process is used with preference for this. In the case of this process, at least two different plastics are used, metallization being possible merely on one of the plastics. In this way it is advantageously already determined during the injection-molding operation at which locations a metallization can take place. The metallization is subsequently produced for example by means of chemical and/or galvanic treatment.

The advantage of the optoelectronic device according to the invention that is represented in FIGS. 1A to 1E is that a higher efficiency than in the case of conventional devices is achieved by the metallization of the recess 12 formed as a reflector. The reflection at the reflector walls (analogous to radial components with metal reflectors) allows narrow-angled, homogeneous radiation characteristics to be produced if the reflector geometry is correspondingly adapted. The geometry of the reflector can in this case be fixed by the injection-molding operation. By contrast with the depicted representation—the reflector could be given the form of a paraboloid, a sphere reflector or some other suitable form.

The device represented in FIGS. 1A to 1E allows a lens to be dispensed with, whereby a planar surface and a small overall height are achieved. The fact that the electrical connection of the semiconductor chip is performed in the interior of the reflector allows the overall height of the optoelectronic device to be reduced further.

Figure 2A:
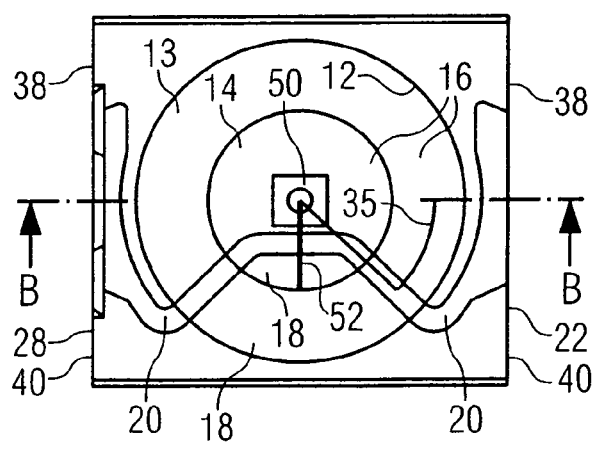
Figure 2D:
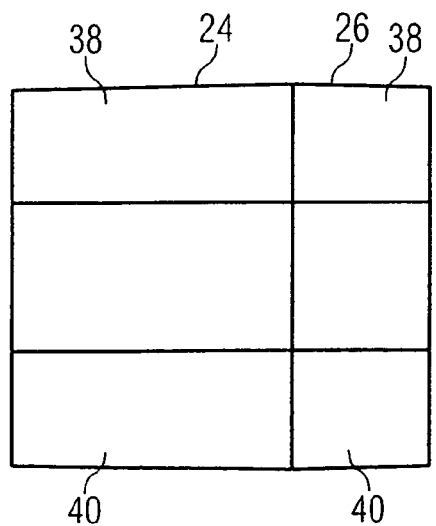

FIG. 2b shows a side view along the section B-B depicted in FIG. 2a. It can be seen well from this representation that the surfaces 22, 24 and 26, 28 of the device are not arranged orthogonally in relation to one another but that the surface 24 is inclined with respect to the surface 22 at an angle 36. The surfaces 24 and 26 are arranged at right angles to each other merely by way of example. Depending on which of the surfaces mentioned is used to fasten the optoelectronic device on a chassis, an inclination of the bottom of the reflector 14 with respect to the bottom of the device 24 or 26 is obtained. By variation of the angle 36, the orientation of the device can be freely and arbirtrarily selected.

For an external electrical terminal, the metallizations 16, 18 extend from the recess over the surface 30 (of the upper side of the device) along the side faces 22 and 28 to the surface areas 24 and 26.

Figure 2E:
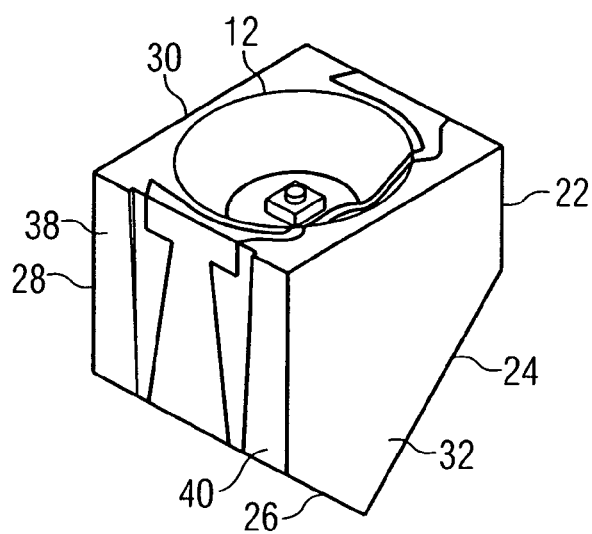
Figure 2F:
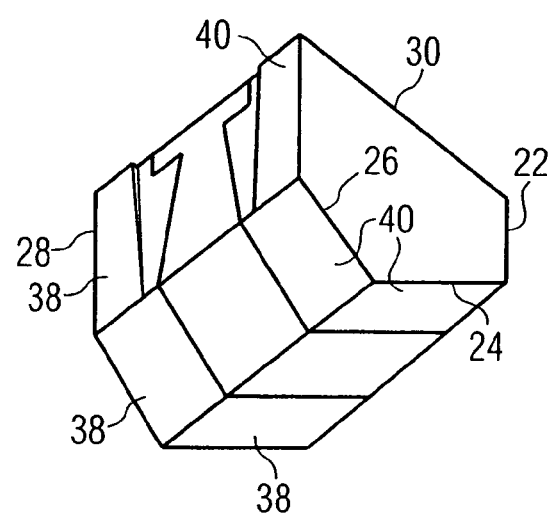

FIGS. 2E and 2F show the second exemplary embodiment respectively in a perspective representation, to be precise FIG. 2E shows a view obliquely from above and FIG. 2F shows a view obliquely from below.

Figure 3B:
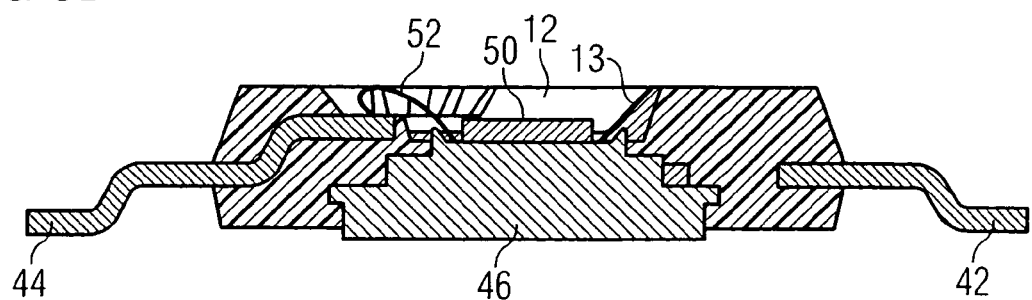
FIGS. 3A, 3B show a schematic representation of a third exemplary embodiment with a semiconductor chip and with a leadframe in a plan view (3A) and a sectional view 3B)
Figure 3A:
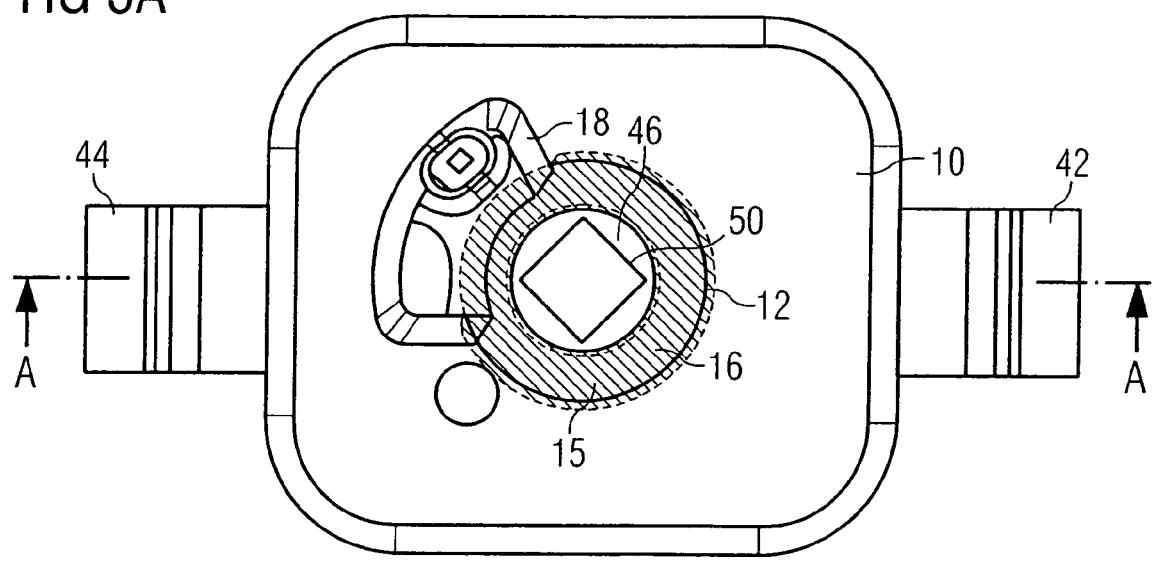

The third exemplary embodiment according to FIG. 3, a surface-mountable device (SMT device), is provided with a leadframe 42, 44. FIG. 3A shows a plan view of the SMT device, while FIG. 3b shows the side view of a section along the line A-A depicted in FIG. 3A.

By contrast with conventional SMT devices of this type, according to the invention a metallization of the wall 13 of the recess 12 is provided, it being possible for the metallization of the wall 13 to be determined for example by a metallizable plastic and/or non-metallizable plastic. The metallization allows the optical properties of the device to be improved considerably. The semiconductor chip 50 is arranged on an electrically conducting heat sink 46, which is electrically connected to the leadframe terminal 42. The semiconductor chip 50 is electrically connected to the second leadframe terminal 44 by means of a bonding wire 52. There is no electrical contact between the electrically conducting heat sink and the metallization on the wall 13 of the recess 12, in order to avoid a short-circuit.

Figure 4A:
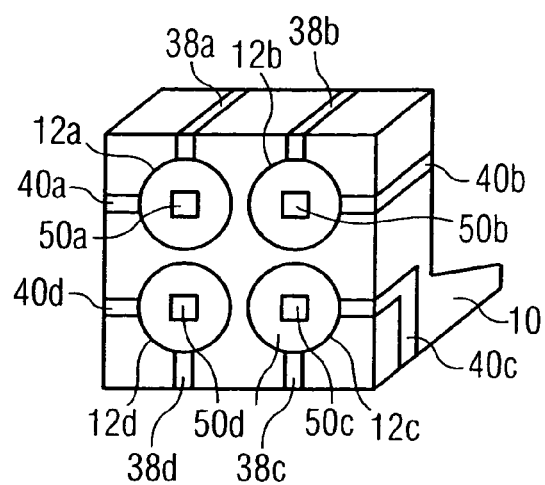
FIGS. 4A, 4B show schematic perspective representations of two exemplary embodiments each with four semiconductor chips.
Figure 4B:
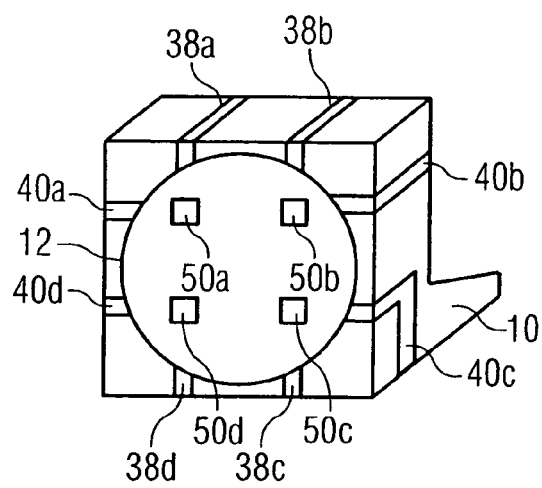

FIGS. 4A and 4B show entirely schematically surface-mountable optoelectronic components which each have, for example, four semiconductor chips 50A, 50B, 50C, 50D.

In FIG. 4A, precisely one semiconductor chip 50a, 50b, 50c, 50d is arranged in a respective recess 12a, 12b, 12c, 12d. Each of the recesses 12a, 12b, 12c, 12d is provided with a metallization, as described in the exemplary embodiments explained above. The metallizations have been omitted in the figure for the sake of overall clarity.

Each of the metallizations in the recesses 12a, 12b, 12c, 12d is divided by an insulating web, which may be arranged for example in the region of a non-metallizable plastic and is not represented in this figure, into two regions that are electrically separated from each other. The respective semiconductor chip is arranged on one of the regions and has a bonding connection to the other region of the metallization. Each of the regions of the metallization is connected via interconnects to electrical terminals 38a, 38b, 38c, 38d and 40a, 40b, 40c, 40d, respectively. Two electrical terminals are arranged on each of the four side faces of the device. Electrical terminals may additionally also be arranged on the rear side of the device, which is not visible in the figure.

If the respective regions of a metallization of a recess 12a, 12b, 12c, 12d do not have any electrical contact with one another, the semiconductor chips 50a, 50b, 50c, 50d can be driven independently of one another. It is also conceivable, however, that the semiconductor chips 50a, 50b, 50c, 50d are electrically connected to one another by means of a metallization located both in the recesses and on the surface of the device.

FIG. 4B shows a similar arrangement, in which however the four semiconductor chips 50a, 50b, . . . , 50h are arranged in a single recess 12. In the case of this variant also, the regions of the metallization can be formed on the enveloping surface of the recess in such a way that no electrical contact is established between the semiconductor chips 50a, 50b, . . . , 50h. However, an electrical connection is quite conceivable if the metallization is correspondingly formed. Representation of the path followed by the metallization has also been dispensed with in this figure for reasons of overall clarity; its pattern can be determined for example by a non-metallizable plastic and/or a metallizable plastic. Electrical terminals 38a, 38b, . . . , 38h and 40a, 40b, . . . , 40h are likewise present on all four side faces of the device, with two electrical terminals being arranged on each surface.

Figure 5:
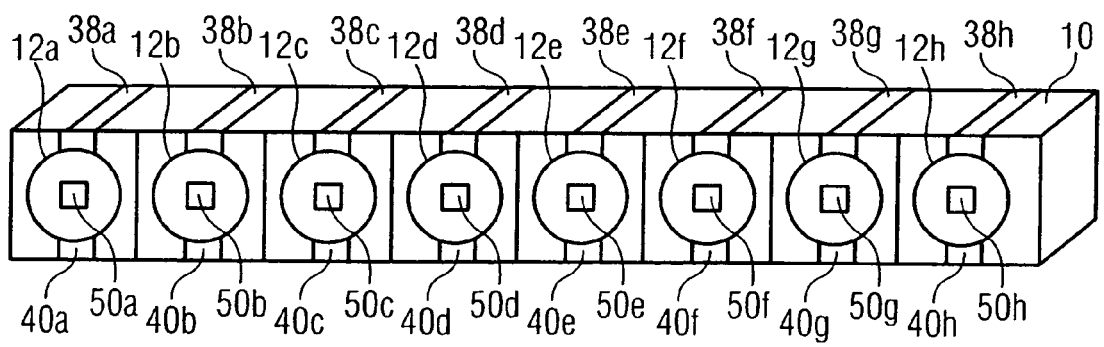
FIG. 5 shows a schematic representation of a perspective view of an exemplary embodiment with a number of recesses, in each of which a semiconductor chip is arranged.

In the exemplary embodiment of FIG. 5, eight recesses 12a, 12b, . . . , 12h, formed as reflectors, are accommodated next to one another in a package 10. Each reflector is provided with a semiconductor chip 50a, 50b, . . . , 50h. The arrangement of the metallization, which can be determined for example by a non-metallizable plastic and/or a metallizable plastic of the package body, has been omitted in the figure for reasons of overall clarity, but may take place in the way represented in FIGS. 1, 2 or 6 in detail. Electrical terminals 38a, 38b, . . . , 38h and 40a, 40b, . . . , 40h are arranged on each of the two opposite side faces and respectively have an electrical connection with a region of the metallization. The electrical terminals 38a, 38b, . . . , 38h and 40a, 40b, . . . , 40h are likewise arranged on the rear side of the device, configured as a "bar", and can, on request, be divided into individual devices by sawing.

The devices represented in FIGS. 4A, b and 5 may be arranged on an assembly both as toplookers and as sidelookers.

Figure 6A:
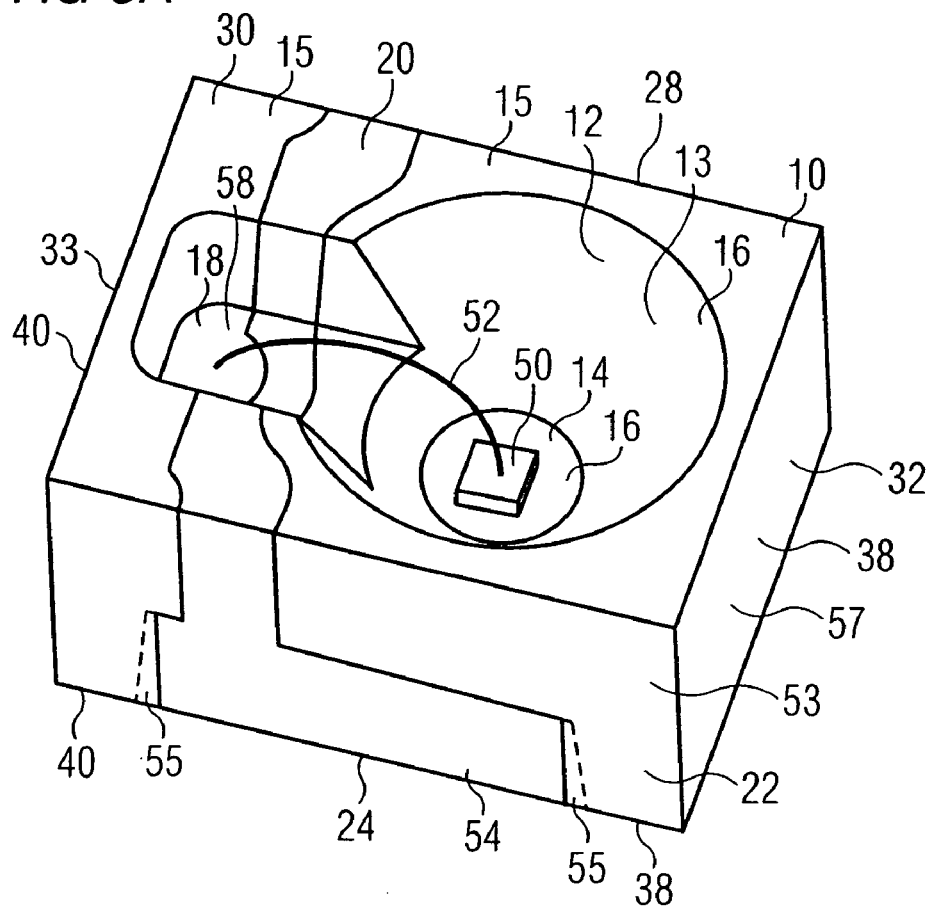
FIGS. 6A to 6C show a schematic representation of an exemplary embodiment with a semiconductor chip in a perspective oblique view (6A), a sectional representation (6B) and a further simplified oblique view (6C)
Figure 6B:
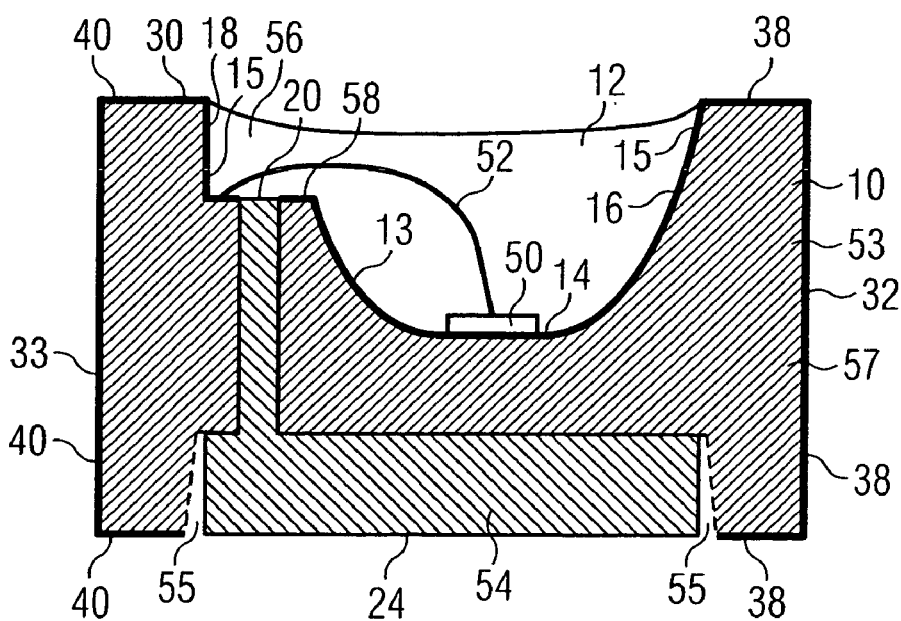
Figure 6C:
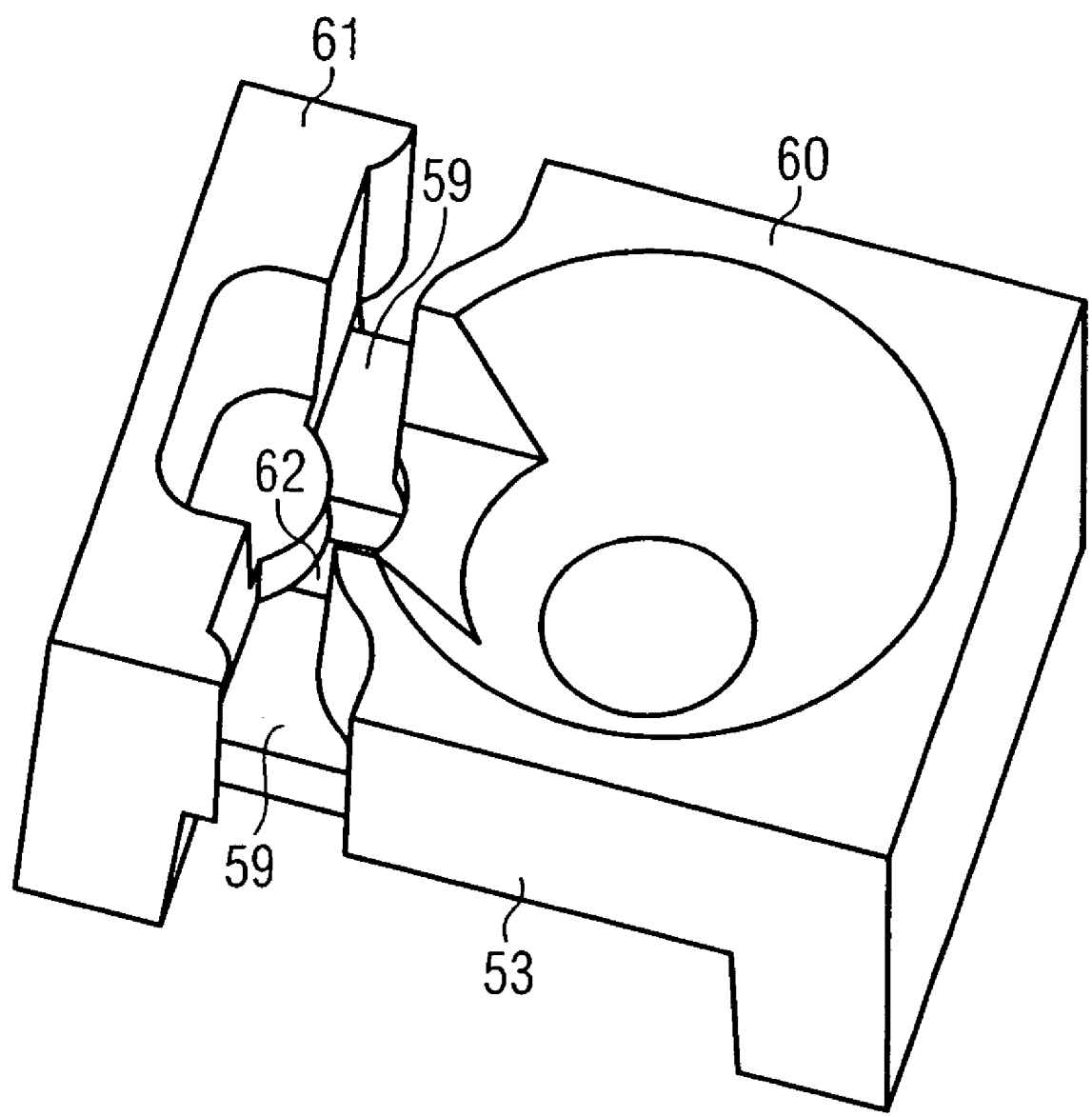

In FIGS. 6A, 6B and 6C, a schematic representation of a further exemplary embodiment of an optoelectronic device according to the invention is represented on the basis of various views.

FIG. 6A schematically shows a perspective oblique view of the optoelectronic device.

A package body 57 of the optoelectronic device, which a package 10 comprises, has a recess 12 with a wall 13 and a bottom 14, on which a semiconductor chip 50 is arranged. One surface 30 of the package body 57 has a metallization 15, which is divided by an insulating web 20 into two subregions 16, 18, which are electrically insulated from each other and form electrical terminals 38, 40 for the contacting of the semiconductor chip 50 on the surfaces 32 and 24, or 33 and 24, respectively. The semiconductor chip 50 is connected in an electrically conducting manner to the terminal 38 via the metallization 16 on the bottom 14 of the recess 13 and to the terminal 40 via the bonding wire 52.

The metallization 15 undertakes an electrical function; it is formed so as to reflect the radiation generated by the semiconductor chip 50 and/or radiation impinging on the semiconductor chip. For example, such a metallization contains Au.

The pattern of the metallization, in particular of the metallization 15 on the surface 30, and of the terminals 38, 40 is determined in this exemplary embodiment by a non-metallizable plastic 54 and a plastic 53 of a metallizable form, with the use of which the package body is produced for example by a two-component injection-molding process.

For example, the plastics 53 and 54 contain an LCP material, it being preferred that the metallizable plastic 53 is provided with an additive, such as for instance an additive in the form of particles and for example containing a metal such as palladium, which advantageously facilitates the metallization of this plastic.

The insulating web 20 is arranged in the region of the surface 30 of the package body 57 in which said surface is formed by the non-metallizable plastic 54. The surfaces 22 and 28 are in this example free from metallization, since this has advantages in that the production of such devices can be achieved in accordance with FIG. 7, in particular when they are produced in large numbers.

In this way, the pattern of a subsequently applied metallization 15 can already be determined during the production of the package body 57.

The insulating web 20 runs in the region of a relief 58 of the wall 13 of the recess 12, which otherwise substantially has a parabolic cross section. This has the advantage that only a very small part of the radiation emerging from the semiconductor chip 50 impinges on the plastic 54 that does not reflect or reflects poorly in comparison with the metallization 16. This allows the efficiency of the optoelectronic component, in particular the reflector that is substantially formed by the metallization 16 of the recess, to be increased.

It is preferred that the semiconductor chip 50 is arranged in the region of the focus of a paraboloid comprising the wall 13 of the recess and may be formed for example as a transmitter or receiver, such as an LED chip, a laser-diode chip, a photodiode chip or as some other, in particular optoelectronic, semiconductor chip.

Represented in FIG. 6B is a schematic sectional view of the device from FIG. 6a along a plane which comprises the bonding wire 52.

Here, the substantially parabolic configuration of the wall 13 of the recess 12 and an envelope 56, which is arranged in the recess, at least partly envelops the chip 50 and advantageously protects it from harmful external influences, can be seen. Particularly advantageously, the surface of the envelope 56 is curved toward the semiconductor chip 50 and/or does not protrude beyond the surface 30. This allows the height of the device to be advantageously kept small. In this exemplary embodiment, the bonding wire 52 is also not led out over the surface 30 and is covered by the envelope 56.

Furthermore, the structure of the package body 57 with the metallizable plastic 53 and the non-metallizable plastic 54 can be seen, determining the form of the metallizations 16, 18 and consequently the shape of the insulating web 20, which is formed in the region of the non-metallizable plastic, as well as the terminals 38, 40 on the surfaces 24, 30, 32 or 33 of the package body 57.

In this exemplary embodiment, the optoelectronic device is formed as a toplooker, with the terminals 38 and 40 on the surface 24 opposite from the surface 30. Other forms, for example sidelookers, can also be produced by modified molds during the injection-molding operation, whereby a different arrangement of the recess or a different pattern of the metallization 15, and consequently of the terminals 38, 40, can be achieved. Sidelookers may also be formed in the form represented in FIG. 6a, in that for example the electrical contacting of the semiconductor chip 50 takes place via the terminal 38 on the surface 32 and the terminal 40 on the surface 33, and the device, in particular the recess, is correspondingly oriented.

The terminals 38 and 40 of the surface-mountable optoelectronic device on the sides of the surfaces 24, 30, 32 or 33 may be soldered for example to the interconnects of a printed circuit board. During the soldering, the device may be exposed to high temperatures. This applies in particular to the region of the terminals 38 and 40 and the adjacent metallizable plastic 53 and non-metallizable plastic 54 of the package body 57, if soldering is carried out on the side of the surface 24 of the package body.

As a consequence, different thermal expansions of the plastics and of the metallization may lead to high mechanical loading of the device, and this in turn may lead to malfunctions or even failures. For example, soldering can lead to fatigue of the metallization 15 in the region of the terminals 38, 40, which may have the consequence of an impairment of the electrical contact with respect to the printed circuit board. The same applies to high temperature differences, to which the component may frequently be exposed during operation, since the metallization dissipates at least part of the heat produced at the chip 50. This is of great significance in particular for high-performance chips, such as for instance high-performance laser chips.

These mechanical loads can be counteracted by means of small slits 55 in the package body, which are preferably arranged in a region around the terminals 38, 40 and with particular preference between the metallizable plastic 53 and the non-metallizable plastic 54. When there is heating of the terminals 38, 40, the slits 55 form a kind of resilience, which advantageously reduces the mechanical loading on the package body 57, in particular due to thermally induced stresses. This is represented in this region in FIGS. 6a and 6b by the dashed lines.

Such slits 55 in the package body 57 can be advantageously formed already during the two-component injection-molding process, in that for example plastics 53, 54 are used, said plastics being substantially chemically inert with respect to each other and consequently entering into a chemical bond with each other only with difficulty, such as for example suitably formed LCPs, which may contain the plastics 53, 54.

The slits 55 may, however, also be provided after the injection-molding operation by means of known, for example mechanical, patterning methods.

To increase the stability of the package body 57, it is preferred that at least part of the package body 57, particularly preferred the part which comprises the metallizable plastic 53, is formed entirely in one piece. As represented in FIG. 6c, this is achieved with preference by connecting webs 59, which are formed in the region of the package body 57 which comprises the non-metallizable plastic. These ensure a mechanical connection between the subregions 60 and 61 of the package body 57. Such connections may also be provided in the exemplary embodiments of FIGS. 1 to 5.

FIG. 6c schematically shows a perspective view of the package body 57 from FIG. 6a without the non-metallizable plastic 54, which is not represented for the sake of overall clarity. In this exemplary embodiment, the connecting webs are separated by an intermediate space 62. This intermediate space allows a high degree of penetration of the piece of the package body that is represented here by the non-metallizable plastic 54. This has the effect of increasing the stability of the package body, in a way similar to the effect of the substantially L-shaped cross section of the region of the non-metallizable plastic 54, as shown in FIG. 6b. This applies in particular if the plastics 53, 54 substantially do not enter into a chemical bond with each other.

With the exception of the exemplary embodiment in FIG. 3, all the examples share the common feature that the devices are configured as Molded Interconnect Devices (MID). By means of this production technique, packages of any design desired and reflectors of any design desired can be produced in a simple way. The application of the metallization can take place by the two-component injection-molding process mentioned above, by means of laser patterning or a masking method. The greatest degrees of freedom, with regard to the configuration of the package body, the forming of the metallization and/or the terminals, is allowed by the two-component injection-molding process. It is advantageously possible to dispense with a patterning of the metallization, which—by the use of a non-metallizable plastic and a metallizable plastic in production of the package body by a two-component injection-molding process— can pattern itself, at least in subregions, during the metallization operation.

A schematic representation of an exemplary embodiment of a method according to the invention for producing an optoelectronic device is represented on the basis of intermediate steps shown in FIGS. 7A to 7F.

In this exemplary embodiment, the production of an optoelectronic device, similar to that shown in FIG. 6, is schematically represented.

Figure 7A:
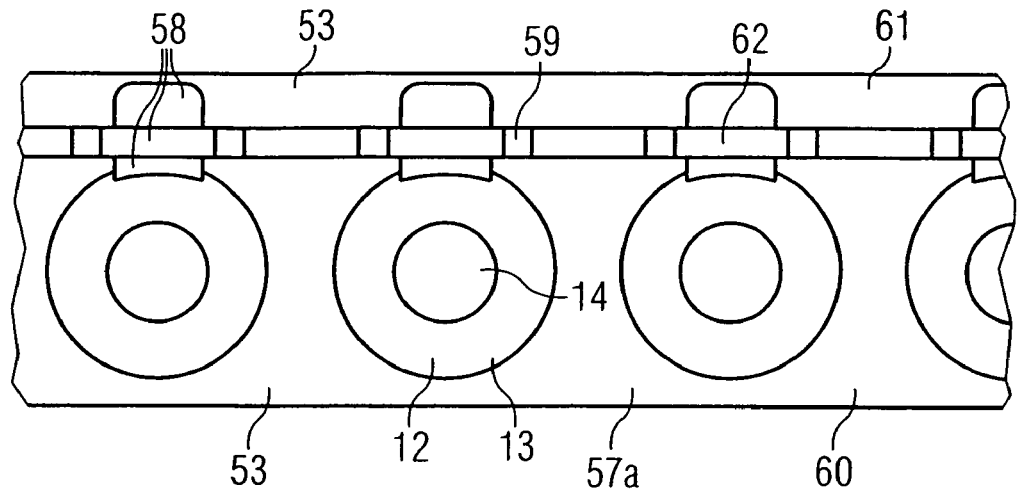
FIGS. 7A to 7F show a schematic representation of an exemplary embodiment of a method sequence according to the invention on the basis of four intermediate steps.

In FIG. 7a, a first piece 57a of a package body of the optoelectronic device that is produced with a metallizable plastic 53 in a first method step by means of an injection-molding process is represented in plan view. The form of the package body piece 57a is determined by a suitable mold during the injection-molding.

It is preferred that the metallizable plastic 53 contains an LCP or PBT, and particularly preferred an additive, for example containing a metal, such as for instance palladium. The additive advantageously facilitates later metallization of the metallizable plastic 53.

In this exemplary embodiment, the package piece 57a is formed in one piece. The regions 60, 61 of the package piece 57a are mechanically connected to each other by means of connecting webs 59. In the region 60, a number of recesses 12 are formed with a wall 13 and a bottom 14 and are arranged with preference with the smallest possible lateral spacing from one another, in order to make the number of recesses 12 in the region 60 advantageously high and in this way optimize the efficiency of the production method. It must be ensured here that the spacing is large enough to allow later separation into individual devices in this region. Like the bottom 14, the recess 12 is in this exemplary embodiment of a substantially circular form in plan view. Provided in the wall 13 of the recess 12 is a relief 58, which is formed in the regions 60 and 61 of the package body piece 57a and extends over the region of the connecting webs 59. The connecting webs 59 are separated from one another in the region of the recesses by intermediate spaces 62.

Figure 7B:
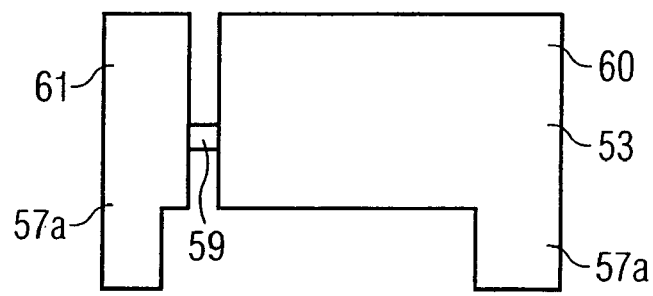

FIG. 7B shows a side view of the package body piece 57a, which contains the metallizable plastic 53 and comprises the regions 60, 61, which are mechanically connected to each other by means of the connecting webs 59.

The connecting webs 59 advantageously connect the regions 60 and 61 of the package body piece 57a in a mechanically stable manner, with the result that the handling of the package body piece 57a during further processing is facilitated.

In a subsequent method step, a further package body piece 57b, which is arranged in the region of the connecting webs 59, is produced with a non-metallizable plastic 54 in a further injection-molding process.

It is preferred that the non-metallizable plastic 54 contains an LCP, and, by contrast with the metallizable plastic 53, particularly preferred that it is substantially free from the additive.

Figure 7C:
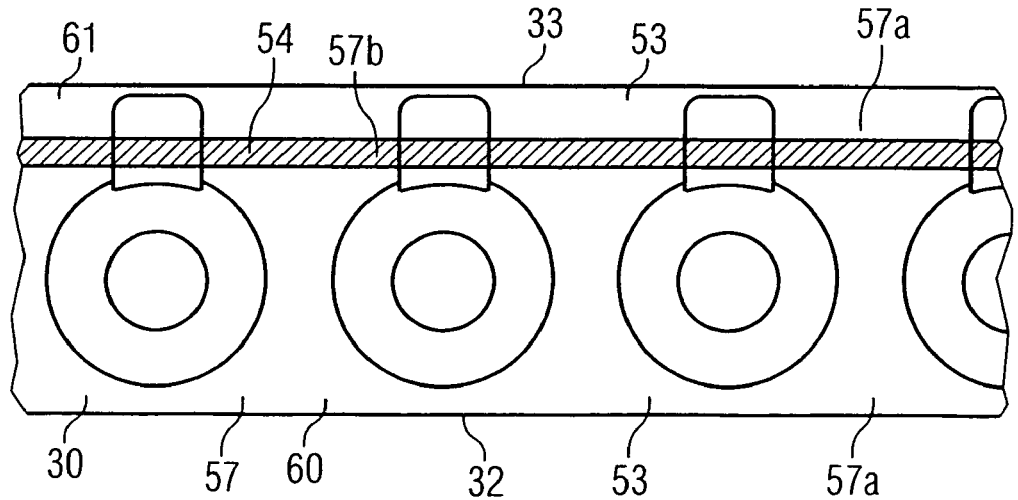
Figure 7D:
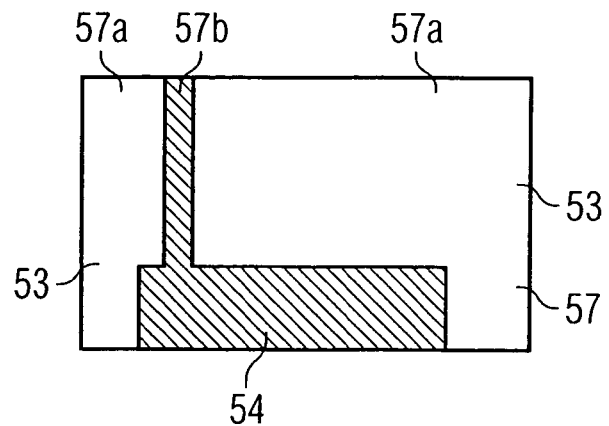

The pattern resulting from the injection-molding process is represented in plan view in FIG. 7C. The package body piece 57b containing the non-metallizable plastic 54 is in this case arranged between the regions 60, 61 of the package body piece 57a that are connected by means of the connecting webs. In particular, in this exemplary embodiment the non-metallizable plastic is arranged in the intermediate spaces 62 between the connecting webs 59. This allows the mechanical stability of the package body 57 comprising the package body pieces 57a and 57b to be increased. This is the case in particular if the metallizable plastic 53 and the non-metallizable plastic 54 do not enter into a chemical bond, or do so only with difficulty, with the result that the stability of the package body 57 is substantially ensured by mechanical means such as the connecting webs 59.

The surface of the package body 57 has, at least in subregions, a metallizable plastic 53 and a non-metallizable plastic 54, which form the two components of the two-component injection-molding process that is schematically reproduced in FIGS. 7a to 7d on the basis of intermediate steps, for the production of a plastic-containing body, in particular a package body 57 for an optoelectronic device.

Subsequently, the package body 57 is metallized in such a patterned manner that a metallization 15 is created in the regions 60, 61 in which the surface of the package body is formed by the metallizable plastic 53.

In a preferred configuration, for this purpose the package body 57, preferably at least on the side of the surface 30, is exposed to an etching process, which acts with respect to the plastics but leaves the additive in the metallizable plastic substantially unchanged. As a result, the density of the additive, for example palladium in the form of particles, is increased on the part of the surface of the plastic body in which it is formed by the metallizable plastic 53. Subsequently, a metal, such as for instance Cu, is applied by means of a chemical treatment, deposited on or adsorbed to substantially only the additive. The region of the non-metallizable plastic 54 is consequently substantially free from Cu atoms and additive, whereas the region of the metallizable plastic 53 is coated over substantially its full surface area with a Cu layer which is, for example, 1-2 µm thick and is created by the adsorption of the Cu to the additive, the density of which has advantageously been increased on the surface of the metallizable plastic 53 by means of the etching process. Further metals, such as for example Ni and/or Au, can be applied thereafter by means of further subsequent chemical and/or galvanic processes to the region of the metallizable plastic 53 that is provided with Cu. The Au thereby preferably forms at least partly the surface of the metallization 15 created in this way.

Figure 7E:
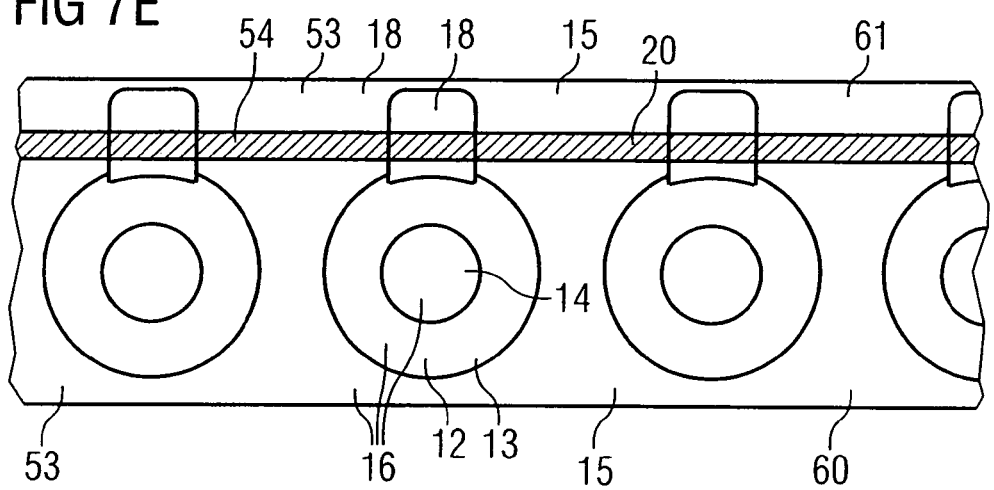

The structure resulting from the metallization operation is represented in plan view in FIG. 7e.

The package body 57 is provided in the regions 60, 61 of the metallizable plastic 53 with the metallization 15, with preference over the full surface area and for example containing Au, said metallization being separated by the insulating web 20 arranged in the region of the non-metallizable plastic 54 into preferably two subregions 16, 18, which are electrically insulated from each other. The bottoms 14 and the walls 13 of the recesses 12 are provided with the metallization 16. In this way, a plastic-containing body, in particular a package body for an optoelectronic device, can be provided with a patterned metallization, the pattern of which can already be determined during the production of the body by the forming of the two plastic components.

It goes without saying that a number of different plastics, in particular metallizable plastics, can also be used. This allows the effect to be achieved that the different plastics have different metallizations, for example containing Ag, Au or Al.

It is preferred that the metallized regions 16, 18 form the terminal conductors for a semiconductor chip 50, which is subsequently fastened, for example by means of a solder, on the bottoms 14 of the recesses 12. The semiconductor chip 50 is thereby connected to the metallization 16, preferably in an electrically conducting manner, for example by means of the solder.

Figure 7F:
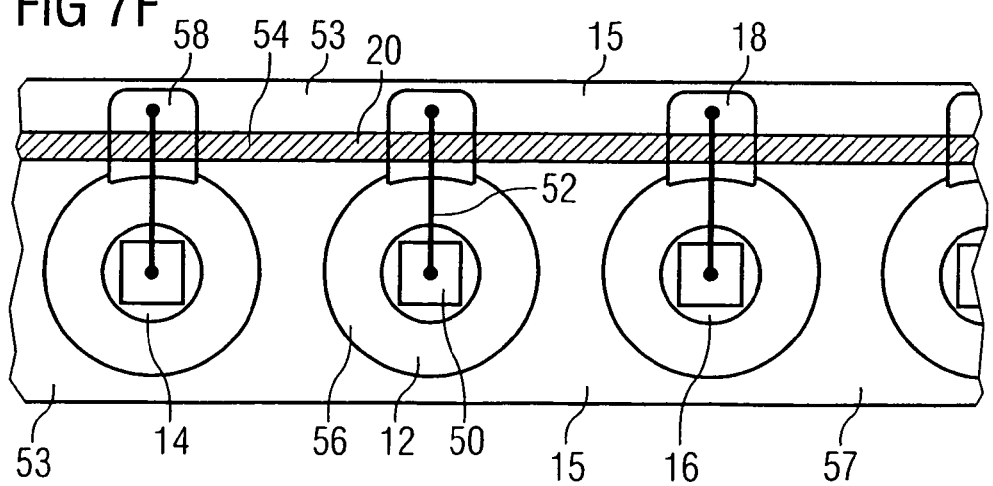

By means of bonding wires 52, the semiconductor chips 50 are subsequently connected in an electrically conducting manner to the region 18 of the metallization 15, whereupon an envelope 56, for example an epoxy, acrylic or silicone resin, which protects the semiconductor chips 50 from harmful external influences can be introduced into the recess. This is shown in FIG. 7F in a plan view.

If the semiconductor chip 50 is formed for example as an optoelectronic chip, the metallization 16 of the recess 12 acts with preference at the same time as an electrical terminal conductor for the semiconductor chip 50 and as a reflector for a radiation generated or to be received by the semiconductor chip.

The plastics 53, 54 consequently advantageously determine already before the metallization of the plastic body 57 the pattern of this metallization and consequently of the later electrical terminals 38, 40 of an optoelectronic device which can be obtained from the pattern shown in FIG. 7e by individual separation. Such a method is suitable in particular for producing large numbers of optoelectronic devices.

This patent application claims the priorities of the German applications DE 103 08 917.9 of Feb. 28, 2003 and DE 203 14 966.1 of Sep. 26, 2003, the entire disclosure of which is hereby explicitly incorporated in the present description by reference. Furthermore the disclosure content of a corresponding PCT application PCT/DE 03/04291 is hereby explicitly incorporated in the present description by reference The extent of protection of the invention and the invention itself are not restricted by the description of the invention on the basis of the exemplary embodiments. Rather, the invention includes any novel feature and any combination of features, which comprises in particular any combination of features in the patent claims and combinations of patent claims, even if this combinations are not explicitly specified in the patent claims.

The invention claimed is:

1. An optoelectronic device, comprising:
 a package body that comprises at least two different plastics, one of the plastics being non-metallizable; and
 at least one semiconductor chip fixed on the package body, wherein a surface of the package body has a metallized subregion and a non-metallized subregion, the non-metallized subregion is formed via the non-metallizable plastic, the metallized subregion is formed via a metallizable plastic, with the metallized subregion being divided into at least two regions that are electrically separated from each other by an insulating web and the insulating web being formed by the non-metallizable plastic.

2. The optoelectronic device as claimed in claim 1, wherein the package body has a recess, in which the semiconductor chip is fixed.

3. The optoelectronic device as claimed in claim 2, wherein the recess is formed as a reflector with a metallization being applied to surfaces of the recess, said metallization forming a metal reflector, and wherein the metallized subregion forms the metallization.

4. The optoelectronic device as claimed in claim 3, wherein the metallization of the recess is applied at least partly to a region of one of the at least two different plastics that is a metallizable plastic.

5. The optoelectronic device as claimed in claim 1, wherein the metallized subregion is an electrical connection.

6. The optoelectronic device as claimed in claim 1, wherein the package body is part of a package of the optoelectronic device.

7. The optoelectronic device as claimed in claim 1, wherein the package body has a recess provided with an indentation or a relief, the insulating web extending at least partly in the indentation or the relief of the recess.

8. The optoelectronic device as claimed in claim 1, wherein the package body is produced using a two-component injection-molding process so that the package body has a first component and a second component.

9. The optoelectronic device as claimed in claim 8, wherein the first and second components are formed by at least one metallizable plastic and at least one non-metallizable plastic, respectively.

10. The optoelectronic device as claimed in claim 1, wherein the package body comprises a first package body piece which, contains the metallizable plastic, and at least one further package body piece, which contains the non-metallizable plastic.

11. The optoelectronic device as claimed in claim 10, wherein the first package body piece is formed in at least two subregions, which are mechanically connected to each other by a connecting device.

12. The optoelectronic device as claimed in claim 11, wherein the further package body piece at least partly is formed around the connecting device.

13. The optoelectronic device as claimed in claim 12, wherein the connecting device mechanically stabilizes the further package body piece.

14. The optoelectronic device as claimed in claim 1, wherein the metallizable plastic and the non-metallizable plastic do not substantially enter into a chemical bond.

15. The optoelectronic device as claimed in claim 10, wherein the first and further body pieces have therebetween at least a portion of an intermediate space.

16. The optoelectronic device as claimed in claim 15, wherein the intermediate space acts as a resilience which at least partly compensates for mechanical stresses of the package body.

17. The optoelectronic device as claimed in claim 11, wherein the connecting device is a plastic connecting device.

18. The optoelectronic device as claimed in claim 12, wherein the connecting device is a plastic connecting device.

19. An optoelectronic device comprising:
a package having at least one recess shaped as a reflector;
at least one semiconductor chip fixed in the recess; and
a metallization applied to surfaces of the recess so as to form a metal reflector, and wherein the metallization is an electrical connection.

20. The optoelectronic device as claimed in claim 19, wherein the package comprises a metalizable plastic, the metallization being applied in the region of the metallizable plastic.

21. The optoelectronic device as claimed in claim 19, further comprising an insulating web dividing the metallization into at least two regions that are electrically separated from each other.

22. The optoelectronic device as claimed in claim 21, wherein the package comprises a non-metalizable plastic, and wherein position of the insulating web is determined by the non-metallizable plastic.

23. The optoelectronic device as claimed in claim 19, wherein the metallization comprises a first region and a second region, the semiconductor chip being applied to the first region of the metallization and an electrical connection is established between the semiconductor chip and the second region of the metallization.

24. The optoelectronic device as claimed in claim 21, wherein the surface area taken up by the insulating web is small in comparison with the metallized surface area in the recess.

25. The optoelectronic device as claimed in claim 23, wherein the recess has an enveloping surface, the insulating web being arranged in a region of the enveloping surface of the recess, and wherein an electrical connection between the semiconductor chip and one of the two regions of the metallization is established in the recess.

26. The optoelectronic device as claimed in claim 25, wherein the insulating web crosses through a bottom of the recess and the electrical connection is established on the bottom of the recess.

27. The optoelectronic device as claimed in claim 21, wherein the semiconductor chip has a front side with a diagonal, the insulating web crossing through the recess and lying in an extension of a plane including the diagonal of the front side of the semiconductor chip.

28. The optoelectronic device as claimed in claim 19, wherein a plastic of the package can be colored in any desired color.

29. The optoelectronic device as claimed in claim 19, wherein the package has at least two adjoining surfaces extending at an arbitrary angle in relation to each other.

30. The optoelectronic device as claimed in claim 19, further comprising at least two electrical terminals each provided on at least two surfaces of the package.

31. The optoelectronic device as claimed in claim 19, wherein the package has metal particles, a heat sink or a through connection.

32. The optoelectronic device as claimed in claim 19, wherein the device is a Molded Interconnect Device.

33. The optoelectronic device as claimed in claim 19, further comprising a leadframe, a region of metallization being formed by the leadframe.

34. The optoelectronic device as claimed in claim 19, wherein the semiconductor chips comprise both optoelectronic semiconductor chips and electronic semiconductor chips.

35. The optoelectronic device as claimed in claim 34, wherein the electronic semiconductor chip is an IC chip operable to drive the optoelectronic semiconductor chips.

36. The optoelectronic device as claimed in claim 19, wherein the at least one semiconductor chip is fixed on the metallization that forms the metal reflector, the semiconductor chip being fixed within the recess.

* * * * *